(12) United States Patent
Sano

(10) Patent No.: US 6,242,801 B1
(45) Date of Patent: *Jun. 5, 2001

(54) SEMICONDUCTOR DEVICE

(75) Inventor: Masashi Sano, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/750,974
(22) PCT Filed: May 10, 1996
(86) PCT No.: PCT/JP96/01267
§ 371 Date: Jan. 2, 1997
§ 102(e) Date: Jan. 2, 1997
(87) PCT Pub. No.: WO96/36074
PCT Pub. Date: Nov. 14, 1996

(30) Foreign Application Priority Data

May 11, 1995 (JP) .................................................. 7-113303
Apr. 25, 1996 (JP) .................................................. 8-105725

(51) Int. Cl.[7] ........................... H01L 23/48; H01L 29/40; H01L 31/12; H01L 23/495
(52) U.S. Cl. ........................ 257/731; 257/646; 257/672; 257/676; 257/724; 257/691; 257/84; 257/80; 257/784
(58) Field of Search .................................... 257/731, 646, 257/787, 676, 668, 672, 691, 692, 723, 724, 778, 784, 80–84, 173, 81, 82, 99, 100, 603; 174/52.2, 52.4; 361/843

(56) References Cited

U.S. PATENT DOCUMENTS

| | | | |
|---|---|---|---|
| 4,392,152 | * 7/1983 | Hirano | 257/668 |
| 5,270,573 | * 12/1993 | Takayanagi et al. | 257/787 |
| 5,313,095 | * 5/1994 | Tagawa et al. | 257/691 |
| 5,397,905 | * 3/1995 | Honda et al. | 257/666 |
| 5,459,350 | * 10/1995 | Date et al. | 257/692 |
| 5,479,050 | * 12/1995 | Pritchard et al. | 257/676 |
| 5,491,360 | * 2/1996 | Lin | 257/676 |
| 5,563,441 | * 10/1996 | Kato | 257/690 |
| 5,598,038 | * 1/1997 | Sugano | 257/787 |
| 5,661,342 | * 8/1997 | Kawamoto | 257/712 |
| 5,704,593 | * 1/1998 | Honda | 257/676 |
| 5,767,573 | * 6/1998 | Noda et al. | 257/676 |

FOREIGN PATENT DOCUMENTS

| | | | |
|---|---|---|---|
| 0 026 788 | 4/1981 | (EP) . | |
| 52-129379 | 10/1977 | (JP) . | |
| 62-34154 | 7/1987 | (JP) . | |
| 63-53983 | * 3/1988 | (JP) | 257/82 |
| 1-123356 | 8/1989 | (JP) . | |
| 1-312858 | 12/1989 | (JP) . | |
| 2-159750 | 6/1990 | (JP) . | |
| 2-191378 | * 7/1990 | (JP) | 257/99 |
| 5-109959 | 4/1993 | (JP) . | |
| 5-190891 | * 7/1993 | (JP) | 257/99 |
| 6-61523 | * 3/1994 | (JP) | 257/81 |

* cited by examiner

Primary Examiner—Alexander O. Williams
(74) Attorney, Agent, or Firm—Arent Fox Kintner Plotkin & Kahn, PLLC

(57) ABSTRACT

A semiconductor device includes a lead terminal that has an island at one end, a semiconductor element whose bottom surface is connected to the island, one or more wires that connect a top surface of the semiconductor element to the island, and a resin seal that seals in the semiconductor device and the wires. In the island, a cut is formed between a section on which one semiconductor element is mounted and a section on which the wires are bonded.

11 Claims, 4 Drawing Sheets

SEMICONDUCTOR DEVICE

TECHNICAL FIELD

The present invention relates to a semiconductor device in which a semiconductor element is mounted on an island, and especially to a semiconductor device in which an island has a characteristic shape.

BACKGROUND ART

Conventionally, a semiconductor device has a structure as described below. Here, a photodetector device having a semiconductor element such as a photodiode is taken as an example.

As shown in FIG. 4, the photodetector device is composed of a common lead 31 having at one end an approximately square-shaped island 31a, specific leads 32 and 33 formed on both sides of and approximately parallel with the common lead 31, a semiconductor element 34 die-bonded on the island 31a, a plurality of wires 35 made of gold or other for electrically connecting the semiconductor element 34 to the top surface of the island 31a and to the specific leads 32 and 33 by wire bonding, and an approximately square-shaped resin seal 36 made of epoxy resin for sealing in the semiconductor element 34 and the wires 35 (the resin seal 36 actually is opaque, though it is shown as transparent in FIG. 4). On the top surface of the above semiconductor element 34 are formed a plurality of projection-like electrode pads (not shown) made of aluminum or other. On these electrode pads are bonded wires 35, of which four are, at the other end, bonded on the top surface of the island 31a and two are, at the other end, bonded on the specific leads 32 and 33, respectively. The first four wires are electrically connected to the island 31a so as to be grounded, and thus serve to adjust the resistance against a current flowing between the specific leads 32 and 33.

The resin seal 36 is so formed as to seal in the semiconductor element 34 and the wires 35 as shown in FIG. 5 by use of a resin-forming mold (not shown). The resin seal 36 has, at its portion approximately above the semiconductor device 34, a hemispherical condenser lens 37 for leading light from outside to the semiconductor element 34.

However, this photodetector has been suffering from a following problem.

The above resin seal 36 is heated to seal in the semiconductor element 34 and the wires 35, and thereafter, as the resin seal 36 cools down, it develops contraction stress inside itself. This causes the wires 35 to be pulled together with the resin, of which the resin seal 36 is made, in the direction of the inward contraction of the resin. On the other hand, the island 31a, on which one end of each wire 35 is stitch-bonded, contracts far less than the resin seal 36 because of their different thermal expansion coefficients.

As a result, the wires 35 are subjected to force that pulls them in the direction of the contraction of the resin and that tends to tear the ends of the wires 35 off the island 31a, and eventually the wires 35 are broken as shown in FIG. 6. Moreover, the same can be caused even by variations in ambient temperature.

An object of the present invention is to provide a highly reliable semiconductor device that is substantially free from wire breakage.

DISCLOSURE OF THE INVENTION

According to the present invention, in a semiconductor device comprising a lead terminal having an island at one end, a semiconductor element whose bottom surface is connected to the island, one or more wires that connect the top surface of the semiconductor element to the island, and a resin seal that seals in the semiconductor element and the wires, said island has a cut formed between a section on which said semiconductor element is mounted and a section on which said wires are bonded.

Moreover, according to the present invention, in a semiconductor device as described above, the cut is so formed as to extend below all the wires.

BEST MODE FOR CARRYING OUT THE INVENTION

Hereinafter, an embodiment of the present invention will be described with reference to FIGS. 1 and 2A, 2B, 2C, 2D and 2E. In the following descriptions, a photodetector device having a semiconductor element including a photodiode element (hereinafter the semiconductor element is referred to as a photodiode element) is dealt with as an example of the semiconductor device of the present invention. This however does not suggest that application of the present invention is limited to particular types of semiconductor device.

Figure 1:
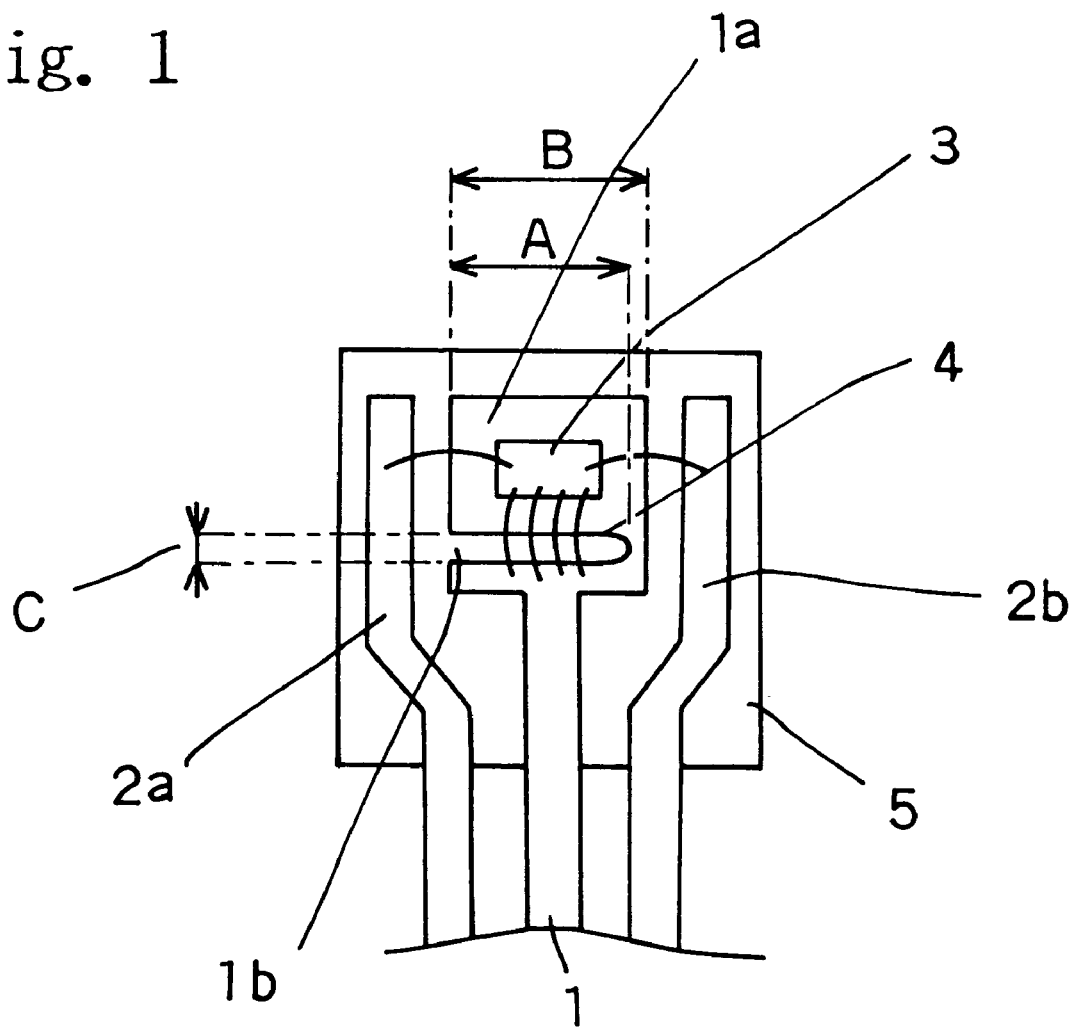
FIG. 1 is a partly-removed plan view showing a photodetector as an example of the semiconductor device of the present invention.

As shown in FIG. 1, the semiconductor device comprises a common lead 1 (lead terminal) having at one end an approximately square-shaped island 1a, specific leads 2a and 2b formed on both sides of and approximately parallel with the common lead 1, a photodiode element 3 that is die-bonded on the island 1a, a plurality of wires 4 made of gold or other for electrically connecting the photodiode element 3 to the top surface of the island 1a and to the specific leads 2a and 2b by wire bonding, and an approximately square-shaped resin seal 5 made of epoxy resin for sealing in the photodiode element 3 and the wires 4 (the resin seal 5 actually is opaque, though it is shown as transparent in FIG. 1).

In the island 1a, a cut 1b is formed between the section on which the photodiode element 3 is mounted and the section on which the wires 4 are bonded. This cut 1b is formed along one side (the side where stitch-bonding of the wires 4 is present in the figure) of the photodiode element 3. The length A of the cut 1b is about 1.9 mm, and the width B of the island is about 2.3 mm. Therefore, the length A of the cut 1b is approximately 80% of the width B of the island. The width C of the cut 1b is about 0.4 mm. Moreover, on the top surface of the photodiode element 3, six electrode pads (not shown) made of aluminum are formed, and, on these electrode pads, the wires 4 are individually bonded at one end.

Of these wires 4, four are, at the other end, stitch-bonded on the top surface of the island 1a, with the wires crossing over the cut 1b, and two are, at the other end, stitch-bonded on the specific leads 2a and 2b, respectively.

Figure 5:
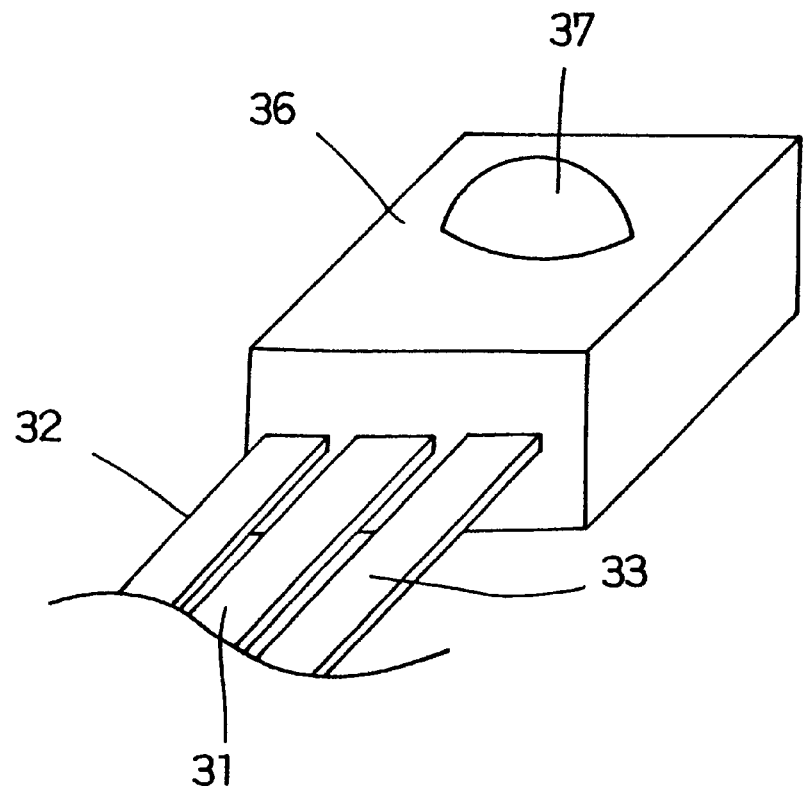
FIG. 5 is a perspective view of the principal portion of the conventional semiconductor device.
Figure 6:
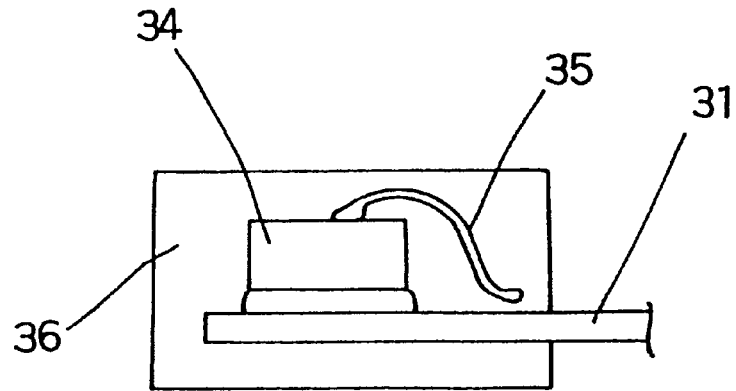
FIG. 6 is a diagram explaining a state of wire breakage in the conventional semiconductor device.

In the photodetector device having the above structure, the resin seal 5 is formed by molding epoxy resin, which is a thermosetting resin, into a shape as described earlier and as shown in FIG. 5 by use of a conventional resin-forming mold.

Specifically, the resin seal 5 is formed, for example, by applying heat-molten epoxy resin over the photodiode element 3 and the wires 4 to seal them in, and then letting the resin cool down to room temperature.

However, as the epoxy resin cools down after heat curing, it develops contraction stress inside itself. This causes the wires 4 as well as the epoxy resin to be subjected to force that pulls them inward in the direction of the contraction. On the other hand, the island 1a, having a cut 1b formed between the section on which the photodiode element 3 is mounted and the section on which the wires 4 are bonded as described earlier, easily deforms in the direction (shown by arrows in FIG. 1) in which those two sections come closer to or apart from each other about the cut 1b. Accordingly, the island 1a allows its portion around the cut 1b to deform easily with the inward contraction of the epoxy resin.

As a result, when the wires 4 are pulled, at their ends bonded on the island 1a, in the direction in which the epoxy resin contracts, the island 1a is also pulled in the same direction in which the epoxy resin contracts. Thus, the possibility of breakage of the wires at their ends bonded on the island 1a can be reduced significantly.

In this embodiment, the cut 1b is so formed as to extend below all the wires 4 so that the island 1a is in a form to deform readily in the direction in which its two sections come close to or apart from each other about the cut 1b. Accordingly, the island 1a allows its portion around the cut 1b (including the portion on which the wires 4 are bonded) to deform easily with the contraction of the resin. As a result, the possibility of wire breakage is reduced significantly.

Figure 2A:
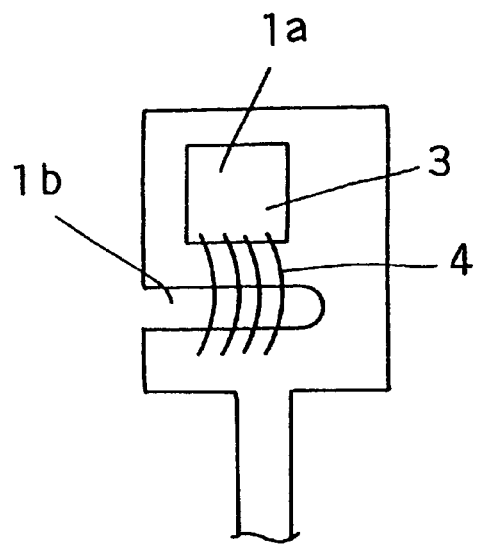
FIGS. 2A, 2B, 2C, 2D and 2E are partly-removed plan views each showing a modified example of the semiconductor device of the present invention.
Figure 2B:
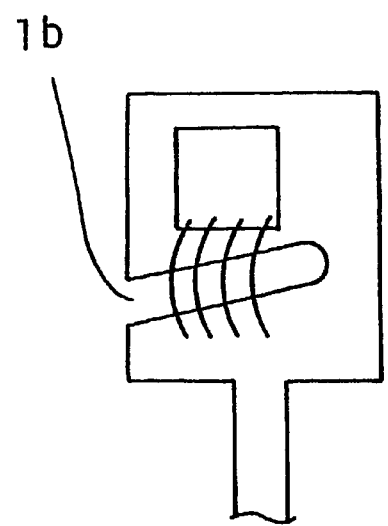
Figure 2C:
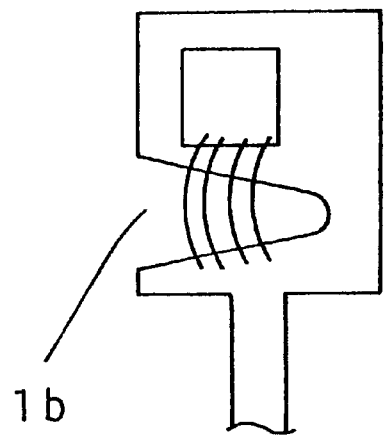
Figure 2D:
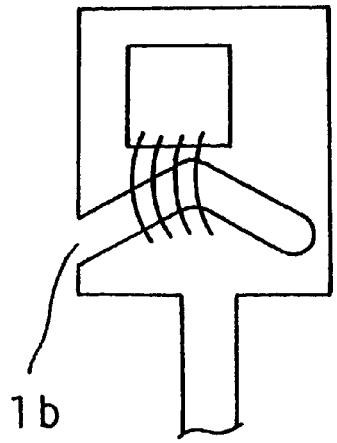
Figure 2E:
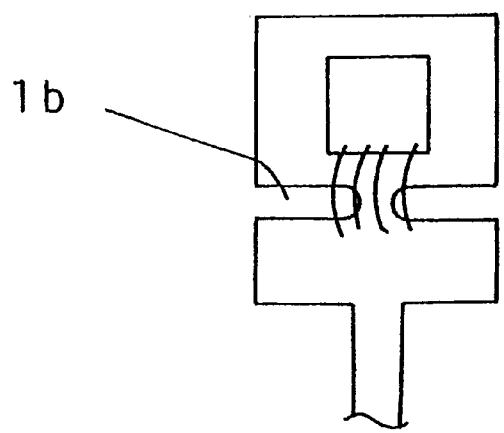

In the above embodiment, the cut 1b is formed, as shown in FIG. 1, along one side of the square-shaped photodiode element 3 so as to be parallel with that side. However, this does not suggest any limitation to the way the cut 1b is formed. In FIG. 2A shows a cut pattern that is substantially the same as that shown in FIGS. 1, and 2B, 2C, 2D and 2E show other cut patterns with which the object of the present invention is achieved. In short, the cut 1b can be formed in any shape and in any position as long as the wires 4 cross over it. Moreover, although there are four wires 4 crossing over the cut 1b in the above embodiment, the present invention can be invariably applied to semiconductor devices having one or more wires.

Furthermore, the length and width of the cut 1b are not limited to particular values as shown in the above embodiment, and it is also possible to form more than one cuts 1b.

Figure 3:
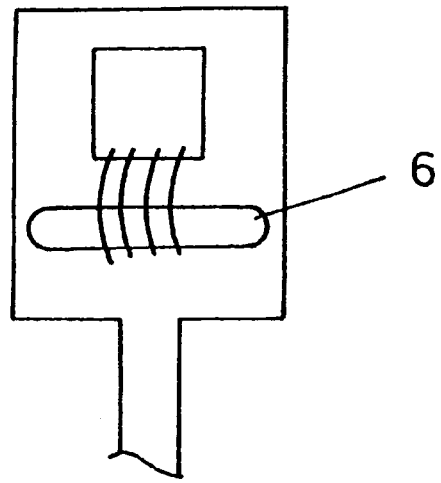
FIG. 3 is a partly-removed plan view showing another modified example of the semiconductor device of the present invention.
Figure 4:
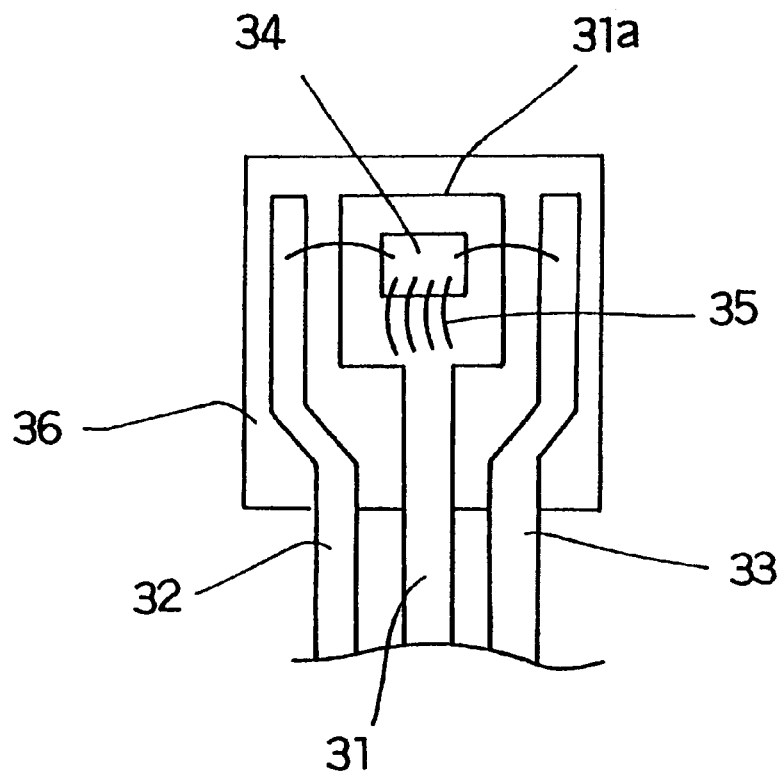
FIG. 4 is a partly-removed plan view showing a conventional semiconductor device.

Moreover, although the cut 1b is formed with one end open, i.e. like a notch, in the above embodiment, it may be formed without an open end, i.e. as a through hole 6, as shown in FIG. 3. In this case, however, in order to achieve the object of the present invention, the through hole 6 needs to be large enough to allow the island to deform easily with the contraction of the epoxy resin. Specifically, the diameter of the through hole 6 (or the major length of the hole, if it is elongated) needs to be close to the width of the island. Of course, it is also possible to form more than one such through hole 6.

Furthermore, although a photodetector device is taken as an example of a semiconductor device in the above embodiment, this does not suggest that application of the present invention is limited to particular types of semiconductor device.

In a semiconductor device according to the present invention, an island has a cut formed between a section on which a semiconductor element is mounted and a section on which wires are bonded. This offers the following advantages.

The semiconductor device is formed, for example, by applying heat-molten thermosetting resin over the semiconductor element and the wires so that they are sealed in in a resin seal. The resin, as it cools down after curing, develops contraction strain inside itself. This causes the wires as well as the resin to be subjected to force that pulls them inward in the direction of the contraction. On the other hand, the island has, as described above, a cut formed between the section on which the semiconductor element is mounted and the section on which the wires are bonded, so that the island is in a form to deform readily in the direction in which its two sections come close to or away from each other about the cut. Accordingly, the island allows its portion around the cut to deform easily with the inward contraction of the resin.

As a result, when the wires are pulled, at their ends bonded on the island, in the direction in which the epoxy resin contracts, the island 1a is also pulled in the same direction in which the epoxy resin contracts. Thus, the possibility of breakage of the wires at their ends bonded on the island 1a can be reduced significantly.

Industrial Applicability

As described above, the present invention can be usefully applied to semiconductor devices including a photodiode element or any other type of semiconductor element, and is especially suitable for semiconductor devices whose semiconductor elements, lead terminals, and wires connecting these are resin-molded.

What is claimed is:

1. A semiconductor device comprising:

an island at only one end of only lead terminal, said island having a first section and second section, a semiconductor element whose button surface is mounted on said first section of the island, one or more wires that connect a top surface of the semiconductor element to said second section of the island, and a resin that seals in the semiconductor device and the wires, wherein said island has a cut formed between a) said first section of said island on which semiconductor element is mounted b) said second section of said island on which all said wires are bonded.

2. A semiconductor device as claimed in claim 1, wherein said cut is so formed as to extend below all of said wires.

3. A semiconductor device as claimed in claim 1, wherein said resin is epoxy resin.

4. A semiconductor device as claimed in claim 1, wherein said semiconductor element is square-shaped and said cut is formed along one side of the semiconductor element, and wherein said wires that are at one connected to said semiconductor element are stitch-bonded on a top surface of said island such that the wires cross over the cut.

5. A semiconductor device as claimed in claim 4, wherein said cut is formed to have a length equal to approximately 80% of a width of said island.

6. A semiconductor device comprising:

an island at only one end of only one lead terminal, said island having a first section and second section, a semiconductor element whose bottom surface is mounted on said first section of the island, one or more wires that connect a top surface of the semiconductor element to said second section of the island, and a resin seal that seals in the semiconductor device and the wires, wherein said island has through hole formed between a) said first section of said island on which said semiconductor elements mounted and b) said second section of said island on which all said wires are bonded.

7. A semiconductor device according to claim 6, wherein said through hole is formed beneath all of said wires.

8. A semiconductor device comprising:

an island at only one end of only one lead terminal, said island having a first section and a second section, a semiconductor element whose bottom surface is mounted on said first section of the island, one or more wires that connect a top surface of the semiconductor element to said second section of the island, and a resin seal that seals in the semiconductor device and the wires, wherein said island has a cut formed between said first section on which said semiconductor element is mounted and said second section on which said wires are bonded, wherein said cut is so formed as to extend below all of said wires.

9. A semiconductor device according to claim 1, wherein all said wires that connect the top surface of the semiconductor element to the island cross over the cut.

10. A semiconductor device according to claim 8, wherein all said wires that connect the top surface of the semiconductor element to the island cross over the cut.

11. A semiconductor device according to claim 6, wherein all said wires that connect the top surface of the semiconductor element to the island cross over the through hole.

* * * * *